United States Patent
Jia et al.

(10) Patent No.: US 9,882,757 B2
(45) Date of Patent: Jan. 30, 2018

(54) SYSTEM AND METHOD FOR MASSIVE MULTIPLE-INPUT MULTIPLE-OUTPUT COMMUNICATIONS

(71) Applicant: Huawei Technologies Co., Ltd., Shenzhen (CN)

(72) Inventors: Ming Jia, Ottawa (CA); Jianglei Ma, Ottawa (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 296 days.

(21) Appl. No.: 14/637,100

(22) Filed: Mar. 3, 2015

(65) Prior Publication Data
US 2015/0256241 A1 Sep. 10, 2015

Related U.S. Application Data

(60) Provisional application No. 61/949,812, filed on Mar. 7, 2014.

(51) Int. Cl.
| | | |
|---|---|---|
| *H04L 27/26* | (2006.01) | |
| *H04B 7/0452* | (2017.01) | |
| *H04B 7/06* | (2006.01) | |
| *H04B 1/04* | (2006.01) | |
| *H04W 52/02* | (2009.01) | |

(52) U.S. Cl.
CPC ....... *H04L 27/2623* (2013.01); *H04B 1/0483* (2013.01); *H04B 7/0452* (2013.01); *H04B 7/0617* (2013.01); *H04W 52/028* (2013.01); *H04B 2001/0408* (2013.01); *Y02B 60/50* (2013.01)

(58) Field of Classification Search
CPC . H04L 27/2623; H04B 1/0483; H04B 7/0452; H04B 7/0617; H04B 7/0413; H04B 7/0615; H04B 7/06; H04B 7/0613; H04B 2001/0408; H04W 52/02; H04W 88/08
USPC .......................................................... 370/330
See application file for complete search history.

(56) References Cited

U.S. PATENT DOCUMENTS

| | | | | |
|---|---|---|---|---|
| 2004/0086027 | A1* | 5/2004 | Shattil ............... | H04L 25/03834 375/146 |
| 2006/0030280 | A1* | 2/2006 | Anderson ............ | H04B 1/0483 455/101 |
| 2007/0178858 | A1* | 8/2007 | Yoon ..................... | H04B 1/406 455/127.1 |

(Continued)

OTHER PUBLICATIONS

International Search Report and Written Opinion of Patent Coorperation Treaty (PCT), International Application No. PCT/CN2015/073722, Applicant Huawei Technologies Co., Ltd., dated May 29, 2015, 12 pages.

*Primary Examiner* — Stephen J Clawson
(74) *Attorney, Agent, or Firm* — Slater Matsil, LLP (57) ABSTRACT

A transmitter adapted for massive multiple-input multiple-output (M-MIMO) operation includes a first set of power amplifiers (PAs) that amplifies a first signal to produce an amplified first signal, and a second set of PAs that amplifies a second signal to produce an amplified second signal, wherein PAs in the first set of PAs are different from PAs in the second set of PAs. The transmitter includes an antenna array operatively coupled to the first set of PAs and the set of second PAs, the antenna array including a plurality of transmit antennas, wherein the antenna array transmits one or more of the amplified signals.

25 Claims, 8 Drawing Sheets

(56) References Cited

U.S. PATENT DOCUMENTS

| | | |
|---|---|---|
| 2008/0266176 A1* | 10/2008 | Nabar .................. H03G 3/3042 |
| | | 342/373 |
| 2008/0300009 A1 | 12/2008 | Quinn et al. |
| 2010/0322343 A1 | 12/2010 | Yeon et al. |
| 2012/0044839 A1 | 2/2012 | Larsson |
| 2013/0121185 A1* | 5/2013 | Li ....................... H04W 72/046 |
| | | 370/252 |
| 2013/0301454 A1 | 11/2013 | Seol et al. |

* cited by examiner

SYSTEM AND METHOD FOR MASSIVE MULTIPLE-INPUT MULTIPLE-OUTPUT COMMUNICATIONS

This application claims the benefit of U.S. Provisional Application No. 61/949,812, filed on Mar. 7, 2014, entitled "Radio Frequency Structure for Massive Multiple-Input Multiple-Output (MIMO)," which application is hereby incorporated herein by reference.

TECHNICAL FIELD

The present disclosure relates generally to digital communications, and more particularly to a system and method for massive multiple-input multiple-output (M-MIMO) communications.

BACKGROUND

Multiple-input multiple-output (MIMO) communications systems use multiple antennas at both the transmitter and receiver of a wireless network to improve signal performance (e.g., spectral efficiency, link reliability, and the like) through the exploitation of spatial diversity. More specifically, MIMO offers significant increases in data throughput and link range without requiring additional bandwidth or increased transmit power. Large-scale antenna systems that utilize MIMO techniques are commonly referred to as Massive MIMO (M-MIMO) systems, and they typically have more service-antennas than the number of active terminals that they service. Extra antennas help by focusing energy into smaller regions of space to bring improvements in throughput and radiated energy efficiency. M-MIMO is a particular case of multi-user MIMO (MU-MIMO) with narrow transmission beams that enable simultaneous service to multiple users. Other benefits of M-MIMO include the extensive use of inexpensive low-power components, reduced latency, simplification of the media access control (MAC) layer, robustness to intentional jamming, and the like. Accordingly, techniques for integrating M-MIMO systems into next-generation wireless networks are desired.

SUMMARY OF THE DISCLOSURE

Example embodiments of the present disclosure which provide a system and method for M-MIMO communications.

In accordance with an example embodiment of the present disclosure, a transmitter adapted for massive multiple input multiple output (M-MIMO) operation is provided. The transmitter includes a first set of power amplifiers (PAs) that amplifies a first signal to produce an amplified first signal, and a second set of PAs that amplifies a second signal to produce an amplified second signal, wherein PAs in the first set of PAs are different from PAs in the second set of PAs. The transmitter includes an antenna array operatively coupled to the first set of PAs and the set of second PAs, the antenna array including a plurality of transmit antennas, where the antenna array transmits one or more of the amplified signals.

In accordance with another example embodiment of the present disclosure, an evolved NodeB (eNB) adapted for massive multiple input multiple output (M-MIMO) operation is provided. The eNB includes an antenna array, and a transmitter operatively coupled to the antenna array. The antenna array includes a plurality of transmit antennas. The transmitter amplify a first signal with a first set of power amplifiers (PAs), amplifies a second signal with a second set of PAs, and transmits at least one of the amplified first signal and the amplified second signal over the antenna array during a first time interval.

In accordance with another example embodiment of the present disclosure, a method for operating a transmitter is provided. The method includes determining, by the transmitter, which one of a first signal and a second signal is to be transmitted during a first time interval, amplifying, by the transmitter, the first signal with a first set of power amplifiers (PAs) to produce an amplified first signal in response to determining that the first signal is to be transmitted during the first time interval, thereby producing an amplified first signal, and amplifying, by the transmitter, the second signal with a second set of PAs to produce an amplified second signal in response to determining that the second signal is to be transmitted during the first time interval. The method includes transmitting, by the transmitter, one of the amplified first signal and the amplified second signal during the first time interval.

In accordance with another example embodiment of the present disclosure, a method for operating a receiving device is provided. The method includes receiving, by the receiving device, an amplified first signal and an amplified second signal during a time interval, wherein the amplified first signal and the amplified second signal are transmitted by an antenna array, wherein the amplified first signal is amplified by a first set of power amplifiers (PAs) and the amplified second signal is amplified by a second set of PAs, and wherein PAs in the first set of PAs are different from PAs in the second set of PAs, and processing, by the receiving device, the first amplified signal and the second amplified signal as received.

One advantage of an embodiment is that the use of separate power amplifiers to provide optimized coverage for different types of transmissions, including broadcast and unicast. Furthermore, the separate power amplifiers may be powered down when not used, thereby helping to reduce power consumption.

A further advantage of an embodiment is that the separate power amplifiers may share antennas. Therefore, the number of antennas does not need to be increased, thereby helping to maintain design simplicity and lower implementation costs.

BRIEF DESCRIPTION OF THE DRAWINGS

For a more complete understanding of the present disclosure, and the advantages thereof, reference is now made to the following descriptions taken in conjunction with the accompanying drawing, in which.

DETAILED DESCRIPTION OF ILLUSTRATIVE EMBODIMENTS

The operating of the current example embodiments and the structure thereof are discussed in detail below. It should be appreciated, however, that the present disclosure provides many applicable inventive concepts that can be embodied in a wide variety of specific contexts. The specific embodiments discussed are merely illustrative of specific structures of the disclosure and ways to operate the disclosure, and do not limit the scope of the disclosure.

One embodiment of the disclosure relates to massive multiple-input multiple-output (M-MIMO) communications. For example, a transmitter amplifies first signals with a first power amplifier (PA) set to produce amplified first signals, and amplifies second signals with a second PA set to produce amplified second signals. The transmitter also transmits at least one of the amplified first signals and the amplified second signals using an antenna array including a plurality of transmit antenna during a first time interval.

The present disclosure will be described with respect to example embodiments in a specific context, namely communications systems that use large antenna arrays and M-MIMO operation to support beamforming gain. The disclosure may be applied to standards compliant communications systems, such as those that are compliant with Third Generation Partnership Project (3GPP), IEEE 802.11, and the like, technical standards, and non-standards compliant communications systems, that support M-MIMO operation.

Figure 1:
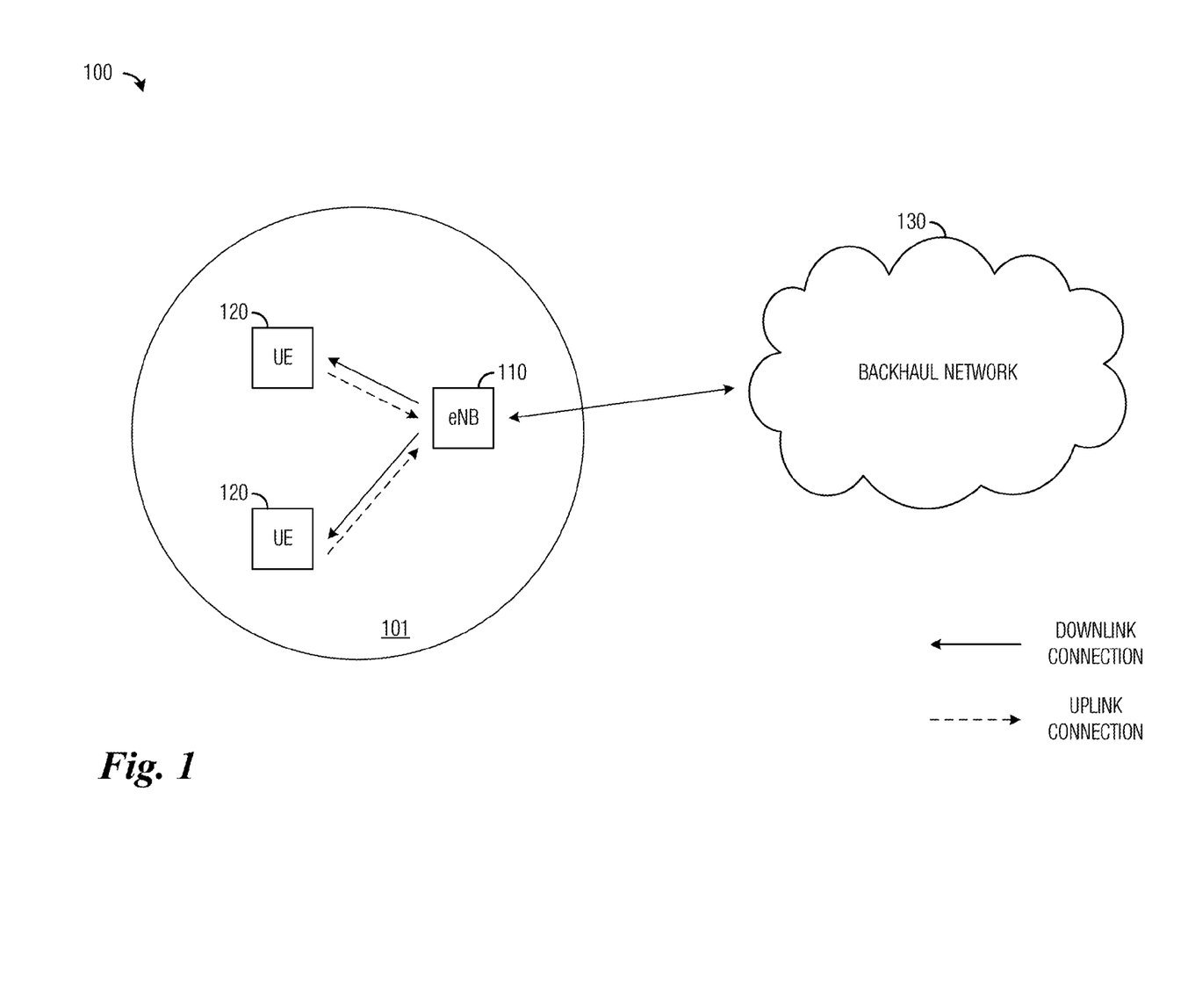
FIG. 1 illustrates an example communications system according to example embodiments described herein.

FIG. 1 illustrates an example communications system 100. Communications system 100 may be used for communicating data. Communications system 100 may include an evolved NodeB (eNB) 110 having a coverage area 101, a plurality of user equipments (UEs) 120, and a backhaul network 130. eNB 110 may comprise any component capable of providing wireless access by establishing uplink (dashed line) and/or downlink (solid line) connections with UEs 120, such as a base station, a NodeB (NB), an access point (AP), a femtocell, a picocell, a relay node, and other wirelessly enabled devices. UEs 120 may comprise any component capable of establishing a wireless connection with eNB 110, such as a subscriber, a mobile, a mobile station (STA), a terminal, a user, or other wirelessly enabled devices. Backhaul network 130 may be any component or collection of components that allow data to be exchanged between eNB 110 and a remote end (not shown). In some embodiments, communications system 100 may comprise various other wireless devices, such as relays, low power nodes, While it is understood that communications systems may employ multiple eNBs capable of communicating with a number of UEs, only one eNB, and two UEs are illustrated for simplicity.

As shown in FIG. 1, eNB 110 may make use of M-MIMO to communicate with UEs 120. In communications systems that use M-MIMO, the number of transmit antennas used by the eNBs will exceed the number of simultaneously served UEs to allow for UE separation and data coverage via beamforming gain. Typically, when the number of transmit antennas used by the eNBs exceed 8, the eNBs may be considered to be using M-MIMO. Generally, when the number of transmit antennas at an eNB increases, communications links (e.g., M-MIMO, MU-MIMO, and the like) and communications with UEs are easier to establish. Higher ratios of transmit antennas to simultaneously served UEs may achieve increased coverage, while lower ratios of transmit antennas to simultaneously served UEs may achieve increased throughput. Therefore, a communications system may trade throughput for coverage (and vice versa) by adjusting the number of active UEs scheduled to receive simultaneous transmissions.

Notably, system information (e.g., control information, scheduling information, and the like) is generally broadcast to many UEs in different spatial locations, and consequently it is typically desirable to maintain a uniform wave radiation pattern for broadcast channels so that acceptable signal to noise ratios (SNR) can be maintained over the entirety of the coverage area of the cell. Furthermore, for UEs that have not performed their initial random access procedure, the network does not know their location; hence the broad coverage area of broadcast channels may simplify the initial random access procedure. In general, broadcast channels convey transmissions over the entirety or substantially the entirety of a coverage area of the cell. Conversely, unicast signals can derive beamforming-gain performance benefits by virtue of spatial selectivity, e.g., by achieving higher SNR ratios at the location of an intended receiver at the expense of lower SNR ratios at other locations. In other words, unicast signals are transmitted to a specific UE, a group of UEs where the signal is labeled for the group of UEs, as well as other situations wherein the signal is transmitted to a subset of all possible recipients. It is noted that when a transmission is transmitted to more than one recipient, but not all recipients, the transmission may be referred to as a multicast.

Conventional M-MIMO techniques use the same transmission drive circuitry (e.g., same amplifier set) to emit the unicast and broadcast signals, which can result in a coverage gap between the broadcast and unicast channels. The coverage gap may be approximately equal to the M-MIMO beamforming gain for near ideal isotropic radiation patterns. Moreover, to achieve near ideal isotropic radiation patterns the power distribution among antennas will have to be uneven, which further reduces coverage. Typically, uneven power amplifier output is a significant problem. In a unicast scenario, the output power of each power amplifier is approximately the same, so the power amplifiers are designed to have the same power rating. However, in the broadcast scenario, the broadcast radiation pattern results in different power output distribution, so some power amplifiers are not fully utilized. Accordingly, techniques for allowing M-MIMO systems to efficiently communicate broadcast and unicast signals simultaneously without significant coverage gaps and/or uneven power outputs are desired.

Aspects of this disclosure use multiple power amplifier sets to communicate over a M-MIMO antenna array in order to improve signal performance when simultaneously emitting unicast and broadcast signals. In some embodiments, one power amplifier set is used for amplifying broadcast signals, and another power amplifier set is used for amplifying unicast signals. The amplified unicast and broadcast signals are then combined, e.g., using radio frequency (RF) combiners, and the combination signal is broadcast using a portion of the M-MIMO array. In one embodiment, the broadcast signals carry system information (e.g., control, scheduling, and the like), while the unicast signals carry non-system information (e.g., data, and the like). Embodiments of this disclosure maintain transmit diversity for broadcast signals without impacting the beam-forming gain experienced by unicast signals. In some embodiments, the broadcast power amplifier set is turned off (or powered down) during intervals in which broadcast signals are not being emitted. In some embodiments, the broadcast power amplifiers may require less functionality than those used in other systems (e.g., may only need to transmit over certain sub-bands), which may allow for implementation of less complex and/or smaller power amplifiers (e.g., less expensive components) than those used in other systems, e.g., conventional M-MIMO and non-M-MIMO networks. Aspects of the disclosure improve spatial diversity for broadcast signals by using antennas with large geographical separation as broadcast antennas.

Figure 2:
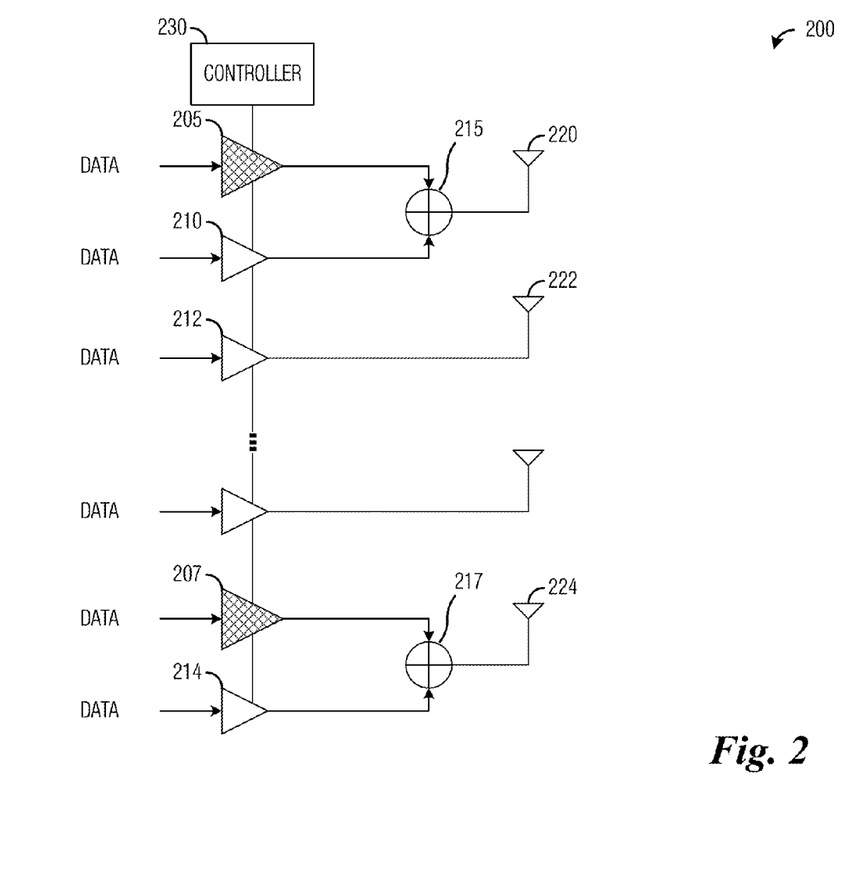
FIG. 2 illustrates a first example transmitter architecture according to example embodiments described herein.

FIG. 2 illustrates a first example transmitter architecture 200. Transmitter architecture 200 provides comparable (to data unicasts) coverage for cell-wide system information broadcasts. Transmitter architecture 200 may be implemented in infrastructure equipment, such as eNBs, APs, base stations, NBs, femtocells, picocells, and the like. As shown in FIG. 2, transmitter architecture 200 includes different power amplifier (PA) sets for broadcast transmissions and unicast transmissions. PAs in the PA set used for broadcast transmissions (broadcast transmission PAs) are shown in FIG. 2 as large cross hatched triangles, such as PA 205 and PA 207, while PAs in the PA set used for unicast transmissions (unicast transmission PAs) are shown as small triangles, such as PA 210, PA 212, and PA 214. According to an example embodiment, the PA set for broadcast transmissions includes one or more PAs for each antenna in a subset of the M-MIMO array and the PA set for unicast transmissions includes one PA for each antenna in the M-MIMO array. It is noted that it is possible to have more than one PA from the PA set per antenna in the M-MIMO array. According to another example embodiment, the PA set for broadcast transmissions includes PAs for fewer than all antennas in the M-MIMO array. As an illustrative example, transmitter architecture 200 includes 2 broadcast transmission PAs (PAs 205 and 207) and N unicast transmission PAs (where N is the number of antennas in the M-MIMO array). The 2 broadcast transmission PAs may be connected to antennas at or near opposite ends of the M-MIMO array (in other words, there is large physical separation between the antennas) to provide spatial diversity.

Transmitter architecture 200 also includes RF combiners, such as RF combiner 215 and RF combiner 217, which combines output signals from broadcast transmission PAs and unicast transmission PAs. As an example, RF combiner 215 combines output signals from PA 205 and PA 210. Output of the RF combiners may be provided to antennas in the M-MIMO array, such as antenna 220, and antenna 224.

The unicast signals and the broadcast signals may be transmitted simultaneously. According to an example embodiment, the unicast signals and the broadcast signals are communicated over different frequency bands. The broadcast transmission PAs may be adapted for narrow band broadcast transmission, while the unicast transmission PAs may be adapted for broadband unicast transmissions.

According to an example embodiment, the PA set used for unicast transmissions may include PAs that are configured for beamforming or broadcast based transmission, while the PA set used for broadcast transmission may include PAs that are configured for broadcast based transmission. As an illustrative example, the unicast transmission PAs may include a relatively large number of low power PAs, while the broadcast transmission PAs may include comparatively fewer high power PAs.

Transmitter architecture 200 may include a controller 230. Controller 230 may be coupled to some or all of the PAs and control their operation, e.g., turn individual PAs power on or power off (or similarly power-up or power-down). As an illustrative example, controller 230 may turn the PAs off when they are not being used to help reduce power consumption. According to an example embodiment, controller 230 may be coupled to the broadcast transmission PAs. According to another example embodiment, controller 230 may be coupled to both the broadcast transmission PAs and the unicast transmission PAs.

Figure 3A:
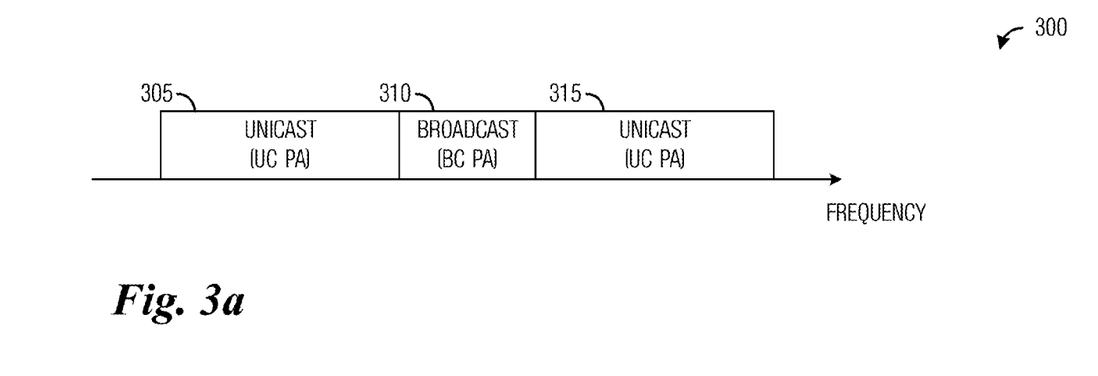
FIG. 3a illustrates a first example RF band for M-MIMO according to example embodiments described herein.

FIG. 3a illustrates a first example RF band 300 for M-MIMO. According to an example embodiment, broadcast transmissions are communicated via narrowband transmissions, while unicast transmissions are communicated via broadband transmissions, e.g., over portions of the frequency spectrum not occupied by the broadcast transmissions. As shown in FIG. 3a, RF band 300 includes a first unicast band 305, a broadcast band 310, and a second unicast band 315. Broadcast band 310 may be smaller (e.g., fewer communications system resources) than first unicast band 305 and/or second unicast band 315. As an illustrative example, in a 10 MHz 3GPP LTE compliant communications system, broadcast band 310 occupies 6 central resource blocks out of a RF band of 50 resource blocks. Although shown in FIG. 3a as being positioned between the two unicast bands, broadcast band 305 may be located anywhere in the frequency spectrum, such as at the beginning or end of the frequency spectrum. Furthermore, there may be multiple broadcast bands, distributed in the frequency spectrum. Therefore, the illustration and discussion of a single broadcast band located in between two unicast bands should not be construed as being limiting to either the scope or the spirit of the example embodiments.

Figure 3B:
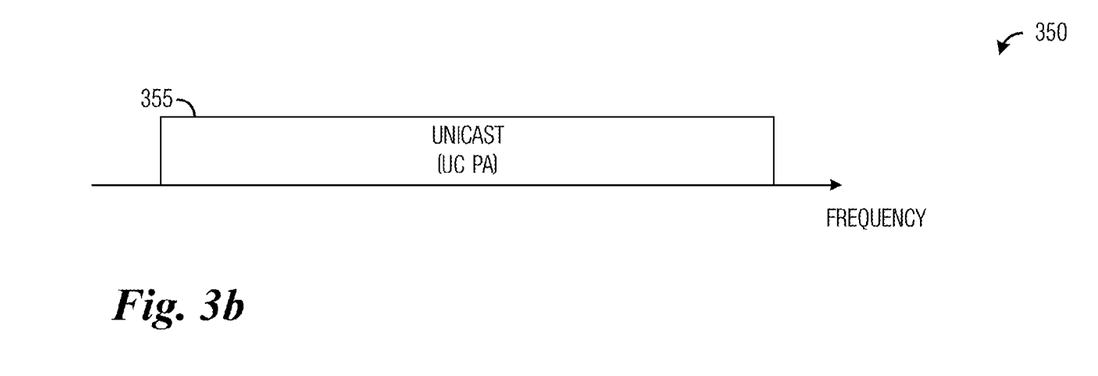
FIG. 3b illustrates a second example RF band for M-MIMO according to example embodiments described herein.

FIG. 3b illustrates a second example RF band 350 for M-MIMO. According to an example embodiment, broadcast transmissions are transmitted over fewer than all time intervals and the broadcast transmission PAs may be powered down during intervals in which broadcast transmissions are not being made. During such intervals, unicast transmissions may be communicated over portions of the frequency spectrum that are otherwise reserved for the broadcast transmissions. As shown in FIG. 3b, RF band 350 includes a single unicast band 355 for the transmission of unicast transmissions by the unicast transmission PAs.

Figure 4:
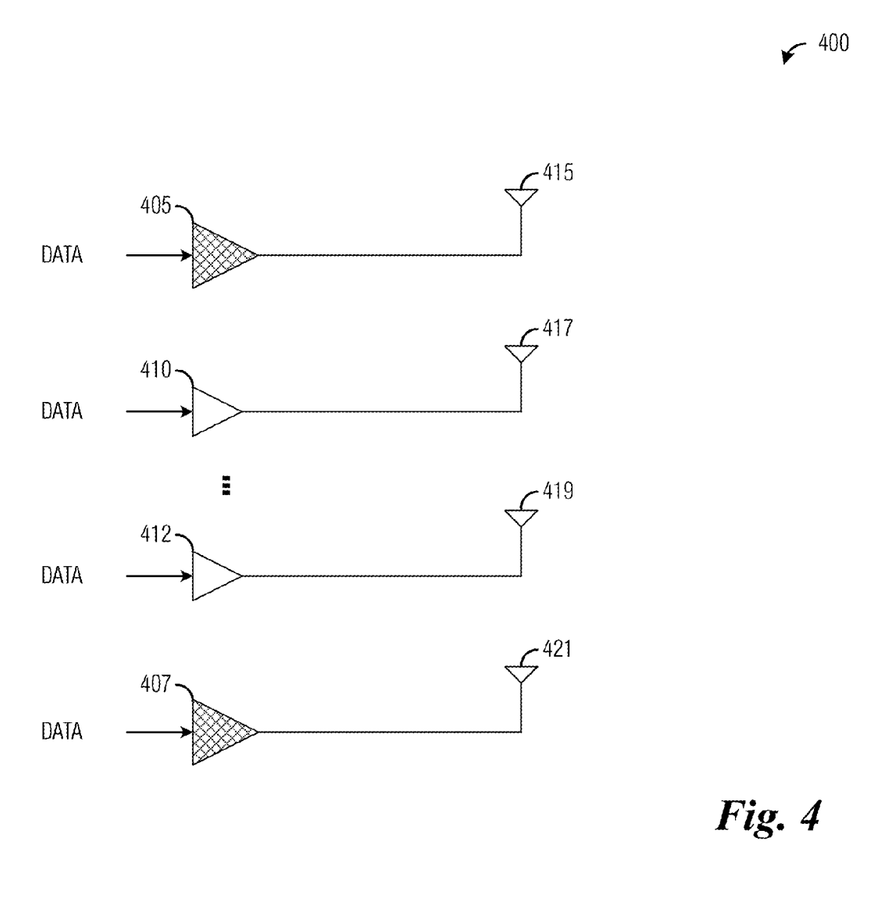
FIG. 4 illustrates a second example transmitter architecture according to example embodiments described herein.

FIG. 4 illustrates a second example transmitter architecture 400. Transmitter architecture 400 provides comparable (to data unicasts) coverage for cell-wide system information broadcasts. Transmitter architecture 400 may be implemented in infrastructure equipment, such as eNBs, APs, base stations, NBs, femtocells, picocells, and the like. As shown in FIG. 4, transmitter architecture 400 uses two PAs to achieve system wide broadcasts, with high power PAs being used for unicasts as well. For the most part, unicast transmissions are transmitted over different antennas than broadcast transmissions in the M-MIMO array. However, the high power PAs used for broadcasts are also used for unicasts. As an example, both broadcast transmission PAs 405 and 407, as well as unicast transmission PAs 410 and 412, transmit unicast transmissions using antennas 415-421 of the M-MIMO array, while only broadcast transmission PAs 405 and 407 transmit broadcast transmissions using antennas 415 and 421.

Figure 5A:
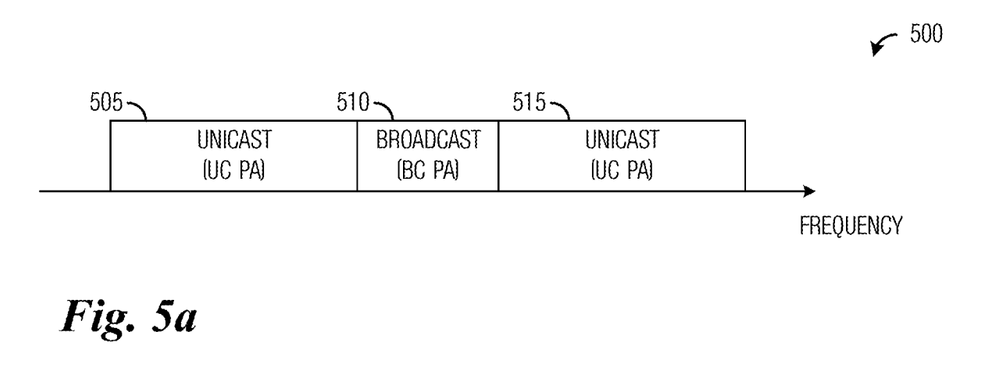
FIG. 5a illustrates a third example RF band for M-MIMO according to example embodiments described herein.

FIG. 5a illustrates a third example RF band 500 for M-MIMO. According to an example embodiment, broadcast transmissions are communicated via narrowband transmissions, while unicast transmissions are communicated via broadband transmissions, e.g., over portions of the frequency spectrum not occupied by the broadcast transmissions. As shown in FIG. 5a, RF band 500 includes a first unicast band 505, a broadcast band 510, and a second unicast band 510.

Figure 5B:
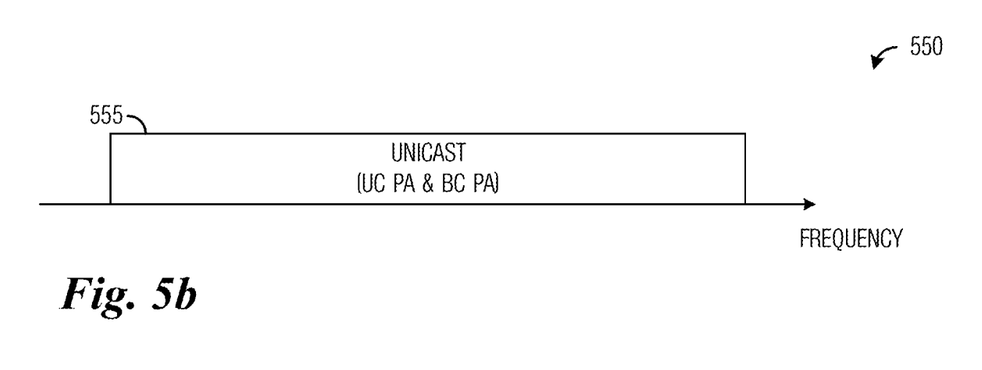
FIG. 5b illustrates a fourth example RF band for M-MIMO according to example embodiments described herein.

FIG. 5b illustrates a fourth example RF band 550 for M-MIMO. According to an example embodiment, broadcast transmissions are transmitted over fewer than all time intervals and the broadcast transmission PAs may be used to make unicast transmissions during intervals in which broadcast transmissions are not being made. During such intervals, unicast transmissions may be communicated over portions of the frequency spectrum that are otherwise reserved for the broadcast transmissions. As shown in FIG. 5b, RF band 550 includes a single unicast band 555 for the transmission of unicast transmissions by the unicast transmission PAs and the broadcast transmission PAs. Such a situation may be particularly well adapted for high mobility UEs since the transmissions of the broadcast transmission PAs can occupy substantially the entirety of the coverage area, making it more likely that the transmissions of the broadcast transmission PAs cover the high mobility UEs.

Figure 6:
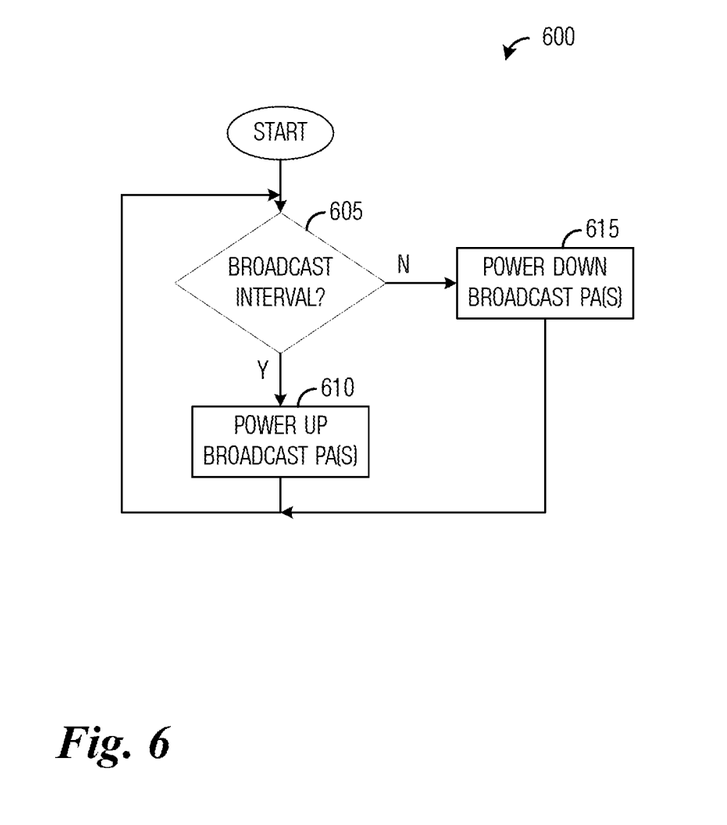
FIG. 6 illustrates a flow diagram of example operations occurring in a controller as the controller sets PA state according to example embodiments described herein.

FIG. 6 illustrates a flow diagram of example operations 600 occurring in a controller as the controller sets PA state. Operations 600 may be indicative of operations occurring in a controller, such as controller 230, as the controller sets PA state.

Operations 600 may begin with the controller performing a check to determine if it is in a broadcast interval (block 605). In other words, the controller is performing a check to determine if the broadcast transmission PAs are to be used to make broadcast transmissions. If it is in a broadcast interval, the controller may power up the broadcast transmission PAs or ensure that the broadcast transmission PAs remain powered on if they are already on (block 610). If it is not in a broadcast interval, the controller may power down the broadcast transmission PAs (block 615). The controller may return to block 605 to repeat the check to determine if it is in the broadcast interval.

Figure 7:
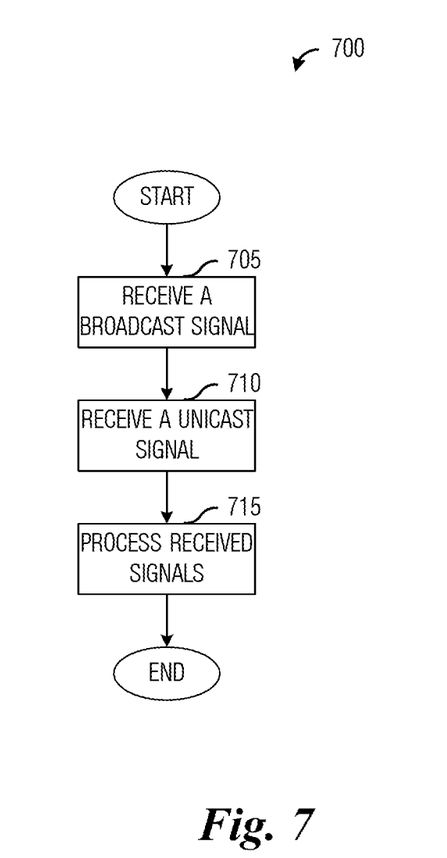
FIG. 7 illustrates a flow diagram of example operations occurring in a UE according to example embodiments described herein.

FIG. 7 illustrates a flow diagram of example operations 700 occurring in a UE. Operations 700 may be indicative of operations occurring in a UE, such as UE 120, as the UE receives transmissions from a M-MIMO array.

Operations 700 may begin with the UE receiving a broadcast signal (block 705). The broadcast signal may be non-beamformed and transmitted from transmit antennas coupled to broadcast transmission PAs. The broadcast signal may be non-UE specific signal. Alternatively, the broadcast signal may be a UE specific signal. The UE may also receive a unicast signal (block 710). The unicast signal may be beamformed and transmitted from transmit antennas coupled to unicast transmission PAs. The unicast signal may be a UE specific signal. The UE may process the broadcast signal and the unicast signal (block 715).

Figure 8:
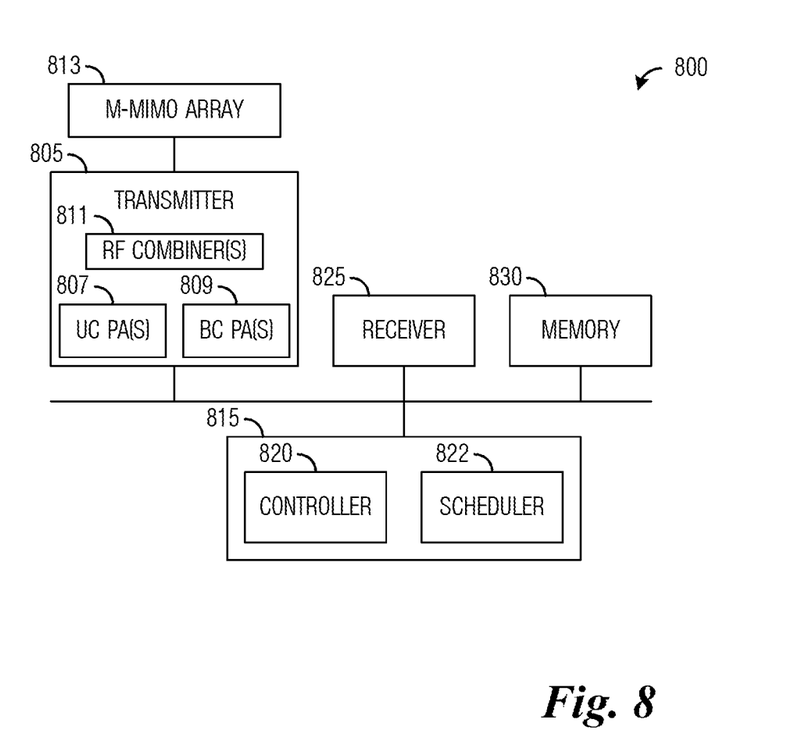
FIG. 8 illustrates an example communications device according to example embodiments described herein.

FIG. 8 illustrates an example communications device 800. Communications device 800 may be an implementation of a communications controller, such as an eNB, a base station, a NodeB, a controller, and the like, in a M-MIMO configuration. Communications device 800 may be used to implement various ones of the embodiments discussed herein. As shown in FIG. 8, a transmitter 805 is configured to transmit unicast transmissions, broadcast transmissions, and the like. Transmitter 805 includes a set of unicast transmission PAs 807 and a set of broadcast transmission PAs 809. The unicast transmission PAs are more numerous than the broadcast transmission PAs, but the broadcast transmission PAs are, on an individual basis, more powerful than the unicast transmission PAs. RF combiners are configured to combine outputs of a subset of the unicast transmission PAs with outputs of the broadcast transmission PAs to allow the sharing of antennas in a M-MIMO array 813. M-MIMO array 813 may have 8 or more transmit antennas. The broadcast transmission PAs may be configured to also make unicast transmissions when not making broadcast transmissions. Communications device 800 also includes a receiver 825 that is configured to receive frames, and the like.

A controller 820 is configured to control the state of PAs, such as broadcast transmission PAs, to enable the turning on and off of the PAs to save power when the PAs are not being used to make transmissions. A scheduler 822 is configured to select a subset of active UEs. A memory 830 is configured to store broadcast information, unicast information, PA state, and the like.

The elements of communications device 800 may be implemented as specific hardware logic blocks. In an alternative, the elements of communications device 800 may be implemented as software executing in a processor, controller, application specific integrated circuit, or so on. In yet another alternative, the elements of communications device 800 may be implemented as a combination of software and/or hardware.

As an example, receiver 810 and transmitter 805 may be implemented as a specific hardware block, while controller 820 and scheduler 822 may be software modules executing in a microprocessor (such as processor 815) or a custom circuit or a custom compiled logic array of a field programmable logic array. Controller 820 and scheduler 822 may be modules stored in memory 830. Alternatively, controller 820 may be implemented as a hardware block in transmitter 805.

Although the present disclosure and its advantages have been described in detail, it should be understood that various changes, substitutions and alterations can be made herein without departing from the spirit and scope of the disclosure as defined by the appended claims.

What is claimed is:

1. A transmitter adapted for massive multiple input multiple output (M-MIMO) operation comprising:
   a first set of power amplifiers (PAs) configured to amplify a broadcast signal to produce an amplified broadcast signal;
   a second set of PAs configured to amplify a unicast signal to produce an amplified unicast signal, wherein PAs in the first set of PAs are different from PAs in the second set of PAs; and
   an antenna array operatively coupled to the first set of PAs and the set of second PAs, the antenna array including a plurality of transmit antennas, wherein the antenna array is configured to transmit the amplified signals.

2. The transmitter of claim 1, wherein the antenna array is configured to:
   broadcast the amplified broadcast signal without transmitting the amplified unicast signal in a first time interval;
   unicast the amplified unicast signal without transmitting the amplified broadcast in the first time interval; or simultaneously broadcast the amplified broadcast signal and unicast the amplified unicast signal in the first time interval.

3. The transmitter of claim 2, wherein the unicast signal is a user equipment specific signal.

4. The transmitter of claim 2, wherein the unicast signal is beamformed prior to transmission.

5. The transmitter of claim 1, further comprising:
a radio frequency (RF) combiner operatively coupled to a first transmit antenna in the antenna array, to a first amplifier in the first set of PAs, and to a second amplifier in the second set of PAs, and configured to combine amplified signals produced by the first amplifier and the second amplifier prior to transmission by the antenna array.

6. The transmitter of claim 1, wherein the antenna array is configured to simultaneously transmit both the amplified broadcast signal and the amplified unicast signal.

7. The transmitter of claim 6, wherein the amplified broadcast signal is transmitted over a first set of frequency sub-bands of a frequency band during a first time interval, and wherein the amplified unicast signal is transmitted over a second set of frequency sub-bands of the frequency band during the first time interval.

8. The transmitter of claim 7, wherein the second set of frequency sub-bands and the first set of frequency sub-bands are separate in frequency.

9. The transmitter of claim 7, further comprising:
a controller operatively coupled to the first set of PAs, the controller configured to set power for the first set of PAs during the first time interval.

10. The transmitter of claim 9, wherein the controller is configured to power off the first set of PAs during a second time interval, wherein the antenna array is configured to not transmit the amplified broadcast signal during the second time interval.

11. The transmitter of claim 10, wherein the antenna array is configured to transmit the amplified unicast signal over both the first set of frequency sub-bands and the second set of frequency sub-bands during the second time interval.

12. The transmitter of claim 7, wherein the antenna array is configured to not transmit the amplified broadcast signal during a second time interval, wherein the first set of PAs is configured to amplify a third signal to produce an amplified third signal, and wherein the antenna array is configured to simultaneously transmit the amplified unicast signal and the amplified third signal in the second time interval.

13. The transmitter of claim 1, wherein a first subset of the plurality of transmit antennas is coupled to the first set of PAs, and a second subset of the plurality of transmit antennas is coupled to the second set of PAs.

14. An evolved NodeB (eNB) adapted for massive multiple input multiple output (M-MIMO) operation comprising:
an antenna array having a plurality of transmit antennas; and
a transmitter operatively coupled to the antenna array, the transmitter configured to amplify a broadcast signal with a first set of power amplifiers (PAs), to amplify a unicast signal with a second set of PAs, wherein PAs in the first set of PAs are different from PAs in the second set of PAs, and to transmit at least one of the amplified broadcast signal or the amplified unicast signal over the antenna array during a first time interval.

15. The eNB of claim 14, further comprising:
a first radio frequency (RF) combiner operatively coupled to a first transmit antenna in the antenna array, to a first amplifier in the first set of PAs, and to a second amplifier in the second set of PAs, the first RF combiner configured to combine amplified signals produced by the first amplifier and the second amplifier prior to transmission by the antenna array.

16. The eNB of claim 14, wherein the transmitter is configured to:
transmit the amplified broadcast signal over a first set of frequency sub-bands of a frequency band during the first time interval; and
transmit the amplified unicast signal over a second set of frequency sub-bands of the frequency band during the first time interval.

17. The eNB of claim 16, further comprising:
a processor operatively coupled to the first set of PAs, the processor configured to power on the first set of PAs during the first time interval.

18. The eNB of claim 17, wherein the processor is configured to power off the first set of PAs during a second time interval, wherein the amplified broadcast signal is not transmitted during the second time interval.

19. The eNB of claim 18, wherein the amplified unicast signal is transmitted over both the first set of frequency sub-bands and the second set of frequency sub-bands during the second time interval.

20. A method for operating a transmitter, the method comprising:
determining, by the transmitter, which one of a broadcast signal and a unicast signal is to be transmitted during a first time interval;
amplifying, by the transmitter, the broadcast signal with a first set of power amplifiers (PAs) to produce an amplified broadcast signal;
amplifying, by the transmitter, the unicast signal with a second set of PAs to produce an amplified unicast signal, PAs in the first set of PAs being different from PAs in the second set of PAs; and
transmitting, by the transmitter using an antenna array comprising a plurality of transmit antennas, one of the amplified broadcast signal or the amplified unicast signal during the first time interval.

21. The method of claim 20, further comprising:
determining that both the broadcast signal and the unicast signal are to be transmitted during the first time interval; and
transmitting both the amplified broadcast signal and the amplified unicast signal during the first time interval.

22. The method of claim 21, further comprising combining a subset of outputs of the first set of PAs and a subset of outputs of the second set of PAs prior to transmitting both the amplified broadcast signal and the amplified unicast signal.

23. The method of claim 21, wherein the amplified broadcast signal is transmitted over a first set of frequency sub-bands of a frequency band during the first time interval, and wherein the amplified unicast signal is transmitted over a second set of frequency sub-bands of the frequency band during the first time interval.

24. The method of claim 20, wherein the broadcast signal is to be transmitted during the first time interval, wherein the unicast signal is to be transmitted during a second time interval, and wherein the method further comprises:
powering on the first set of PAs during the first time interval; and
powering off the first set of PAs during the second time interval.

25. The method of claim 24, further comprising:
transmitting the amplified broadcast signal over a first set of frequency sub-bands during the first time interval;
transmitting the amplified unicast signal over a second set of frequency sub-bands during the first time interval; and
transmitting the amplified unicast signal over both the first set of frequency sub-bands and the second set of frequency sub-bands during the second time interval.

\* \* \* \* \*